(12) United States Patent
Lei et al.

(10) Patent No.: US 10,020,431 B2
(45) Date of Patent: Jul. 10, 2018

(54) SEALED SEMICONDUCTOR LIGHT EMITTING DEVICE

(71) Applicant: KONINKLIJKE PHILIPS N.V., Eindhoven (NL)

(72) Inventors: Jipu Lei, San Jose, CA (US); Stefano Schiaffino, Pleasanton, CA (US); Alexander H. Nickel, Santa Clara, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 14/387,591

(22) PCT Filed: Mar. 22, 2013

(86) PCT No.: PCT/IB2013/052290
§ 371 (c)(1),
(2) Date: Sep. 24, 2014

(87) PCT Pub. No.: WO2013/144801
PCT Pub. Date: Oct. 3, 2013

(65) Prior Publication Data
US 2015/0076538 A1    Mar. 19, 2015

Related U.S. Application Data

(60) Provisional application No. 61/617,692, filed on Mar. 30, 2012.

(51) Int. Cl.
*H01L 33/52* (2010.01)
*H01L 33/32* (2010.01)
(Continued)

(52) U.S. Cl.
CPC ............ *H01L 33/52* (2013.01); *H01L 21/561* (2013.01); *H01L 21/6835* (2013.01);
(Continued)

(58) Field of Classification Search
CPC ..... H01L 33/52; H01L 33/0079; H01L 33/32; H01L 33/62; H01L 33/0025;
(Continued)

(56) References Cited

U.S. PATENT DOCUMENTS 5,696,389 A  *  12/1997  Ishikawa ................ B82Y 20/00
                                              257/773
6,876,008 B2     4/2005  Bhat
(Continued)

FOREIGN PATENT DOCUMENTS

CN       102194985 A     9/2011
CN       102214617 A    10/2011
(Continued)

OTHER PUBLICATIONS

Article 94(3) EPC Office Action dated Dec. 5, 2016, European Patent Application No. 13722081.0, 6 pages.
(Continued)

*Primary Examiner* — Tucker J Wright

(57) ABSTRACT

A method according embodiments of the invention includes providing a wafer of semiconductor devices. The wafer of semiconductor devices includes a semiconductor structure comprising a light emitting layer sandwiched between an n-type region and a p-type region. The wafer of semiconductor devices further includes first and second metal contacts for each semiconductor device. Each first metal contact is in direct contact with the n-type region and each second metal contact is in direct contact with the p-type region. The method further includes forming a structure that seals the semiconductor structure of each semiconductor device. The wafer of semiconductor devices is attached to a wafer of support substrates.

24 Claims, 4 Drawing Sheets

(51) Int. Cl.
*H01L 33/62* (2010.01)
*H01L 21/683* (2006.01)
*H01L 21/56* (2006.01)
*H01L 23/00* (2006.01)
*H01L 33/00* (2010.01)
*H01L 33/38* (2010.01)

(52) U.S. Cl.
CPC ...... *H01L 33/0025* (2013.01); *H01L 33/0075* (2013.01); *H01L 33/0079* (2013.01); *H01L 33/32* (2013.01); *H01L 33/387* (2013.01); *H01L 33/62* (2013.01); *H01L 24/29* (2013.01); *H01L 24/32* (2013.01); *H01L 24/83* (2013.01); *H01L 24/94* (2013.01); *H01L 33/007* (2013.01); *H01L 33/382* (2013.01); *H01L 2221/6835* (2013.01); *H01L 2221/68377* (2013.01); *H01L 2221/68381* (2013.01); *H01L 2224/2919* (2013.01); *H01L 2224/29076* (2013.01); *H01L 2224/29144* (2013.01); *H01L 2224/29186* (2013.01); *H01L 2224/32227* (2013.01); *H01L 2224/32235* (2013.01); *H01L 2224/83005* (2013.01); *H01L 2224/83007* (2013.01); *H01L 2224/83192* (2013.01); *H01L 2224/83815* (2013.01); *H01L 2224/94* (2013.01); *H01L 2924/01322* (2013.01); *H01L 2924/12041* (2013.01); *H01L 2924/12042* (2013.01); *H01L 2933/005* (2013.01); *H01L 2933/0016* (2013.01); *H01L 2933/0066* (2013.01)

(58) Field of Classification Search
CPC ............. H01L 33/0075; H01L 21/6835; H01L 21/561; H01L 2224/16155–2224/16168; H01L 2224/16225–2224/1624
See application file for complete search history.

(56) References Cited

U.S. PATENT DOCUMENTS

| | | | | |
|---|---|---|---|---|
| 7,786,596 | B2 | 8/2010 | Chen | |
| 7,977,686 | B2 | 7/2011 | Ibbetson | |
| 2005/0062060 | A1* | 3/2005 | Nagai et al. | 257/100 |
| 2005/0104220 | A1* | 5/2005 | Tsuchiya et al. | 257/774 |
| 2005/0156185 | A1* | 7/2005 | Kim et al. | 257/99 |
| 2007/0096130 | A1 | 5/2007 | Schiaffino et al. | |
| 2007/0126016 | A1* | 6/2007 | Chen et al. | 257/96 |
| 2008/0149942 | A1 | 6/2008 | Yi et al. | |
| 2009/0267085 | A1* | 10/2009 | Lee | F21K 9/00 257/88 |
| 2010/0012963 | A1* | 1/2010 | Hwan | 257/98 |
| 2010/0148185 | A1* | 6/2010 | Hsu | H01L 33/382 257/76 |
| 2010/0327299 | A1 | 12/2010 | Chung et al. | |
| 2011/0073890 | A1 | 3/2011 | Sugizaki et al. | |
| 2011/0101539 | A1* | 5/2011 | Kato | 257/774 |
| 2011/0204395 | A1* | 8/2011 | Hong et al. | 257/94 |
| 2011/0215365 | A1* | 9/2011 | Lin | 257/99 |
| 2011/0223696 | A1 | 9/2011 | Basin | |
| 2011/0233586 | A1* | 9/2011 | Kojima et al. | 257/98 |
| 2011/0241061 | A1* | 10/2011 | Yu et al. | 257/99 |
| 2011/0297969 | A1* | 12/2011 | Kojima et al. | 257/88 |
| 2011/0297994 | A1 | 12/2011 | Sugizaki et al. | |
| 2011/0297997 | A1* | 12/2011 | Izuka et al. | 257/99 |
| 2012/0074441 | A1 | 3/2012 | Seo et al. | |
| 2012/0104445 | A1* | 5/2012 | Yang et al. | 257/98 |
| 2012/0168792 | A1* | 7/2012 | Kang et al. | 257/94 |
| 2012/0181558 | A1* | 7/2012 | Hwang | 257/98 |
| 2012/0223416 | A1 | 9/2012 | Scheubeck et al. | |
| 2013/0020589 | A1* | 1/2013 | Yu et al. | 257/88 |

FOREIGN PATENT DOCUMENTS

| | | |
|---|---|---|
| DE | 102009053064 A1 | 5/2011 |
| JP | 2005123657 A | 5/2005 |
| JP | 2006114820 A | 4/2006 |
| JP | 2010514191 A | 4/2010 |
| JP | 2010103186 A | 5/2010 |
| JP | 2011071273 A | 4/2011 |
| JP | 2011187941 A | 9/2011 |
| JP | 2011199193 A | 10/2011 |
| JP | 2011222993 A | 11/2011 |
| WO | 2011055249 A2 | 5/2011 |
| WO | WO-2011/058094 A1 | 5/2011 |

OTHER PUBLICATIONS

JP Office Action, Application 2015-502504, LUM reference 2011P01927WOJP, dated Jan. 10, 2017, 7 pps.
CN Office Action, Application 201380018252.0, LUM reference 2011P01927WOCN, dated Aug. 1, 2016, 25 pps.
CN Second Office Action dated Jun. 20, 2017, China Patent Application No. 201380018252.0, LUM Reference No. 2011P01927WOCN, 26 pages.
China Decision of Rejection dated Dec. 5, 2017, China Patent Application No. 201380018252.0, 21 pages.
Notice of Reason for Rejection dated Sep. 12, 2017, Japan Patent Application No. 2015-502504, 8 pages.
EPC Article 94(3) dated Sep. 26, 2017, European Patent Application No. 13722081.0, 6 pages.
EPO as ISA, PCT/IB2013/052290 filed Mar. 22, 2013, "International Search Report and Written Opinion", dated Aug. 22, 2013, 10 pages.

* cited by examiner

SEALED SEMICONDUCTOR LIGHT EMITTING DEVICE

CROSS-REFERENCE TO PRIOR APPLICATIONS

This application is the U.S. National Phase application under 35 U.S.C. § 371 of International Application No. PCT/IB2013/052290, filed on Mar. 22, 2013, which claims the benefit of U.S. Patent Application No. 61/617,692, filed on Mar. 30, 2012. These applications are hereby incorporated by reference herein.

FIELD OF THE INVENTION

The present invention relates to a semiconductor light emitting device including a structure that seals the semiconductor structure.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a light emitting diode die 110 attached to a submount 114, described in more detail in U.S. Pat. No. 6,876,008. Electrical connections between the solderable surfaces on the top and bottom surfaces of the submount are formed within the submount. The solderable areas on the top of the submount, on which solder balls 122-1 and 122-2 are disposed, are electrically connected to the solderable areas on the bottom of the submount, which attach to solder joint 138, by a conductive path within the submount. Solder joint 138 electrically connects solderable areas on the bottom of the submount to a board 134. Submount 114 may be, for example, a silicon/glass composite submount with several different regions. Silicon regions 114-2 are surrounded by metalizations 118-1 and 118-2, which form the conductive path between the top surface and the bottom surface of the submount. Circuitry such as ESD protection circuitry may be formed in the silicon regions 114-2 surrounded by metalizations 118-1 and 118-2, or in other silicon region 114-3. The other silicon regions 114-3 may also electrically contact the die 110 or board 134. Glass regions 114-1 electrically isolate different regions of silicon. Solder joints 138 may be electrically isolated by an insulating region 135 which may be, for example, a dielectric layer or air.

In the device illustrated in FIG. 1, the submount 114 including metalizations 118-1 and 118-2 is formed separately from die 110, before die 110 is attached to submount 114. For example, U.S. Pat. No. 6,876,008 explains that a silicon wafer, which is comprised of sites for many submounts, is grown to include any desired circuitry such as the ESD protection circuitry mentioned above. Holes are formed in the wafer by conventional masking and etching steps. A conductive layer such as a metal is formed over the wafer and in the holes. The conductive layer may then be patterned. A layer of glass is then formed over the wafer and in the holes. Portions of the glass layer and wafer are removed to expose the conductive layer. The conductive layer on the underside of the wafer may then be patterned and additional conductive layers may be added and patterned. Once the underside of the wafer is patterned, individual LED dice 110 may be physically and electrically connected to the conductive regions on the submount by interconnects 122. In other words, the LEDs 110 are attached to the submount 114 after being diced into individual diodes.

SUMMARY

It is an object of the invention to provide a wafer-scale method for attaching a wafer of semiconductor devices to a support substrate wafer such that each device is hermetically sealed by the attachment to the support substrate wafer, to reduce or eliminate contamination during later processing steps such as dicing and application of wavelength converting materials and/or lenses.

A method according embodiments of the invention includes providing a wafer of semiconductor devices. The wafer of semiconductor devices includes a semiconductor structure comprising a light emitting layer sandwiched between an n-type region and a p-type region. The wafer of semiconductor devices further includes first and second metal contacts for each semiconductor device. Each first metal contact is in direct contact with the n-type region and each second metal contact is in direct contact with the p-type region. The method includes forming a structure that seals the semiconductor structure of each semiconductor device. The wafer of semiconductor devices is attached to a wafer of support substrates.

DETAILED DESCRIPTION

In embodiments of the invention, a semiconductor light emitting device is bonded to a mount in a wafer scale process. Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
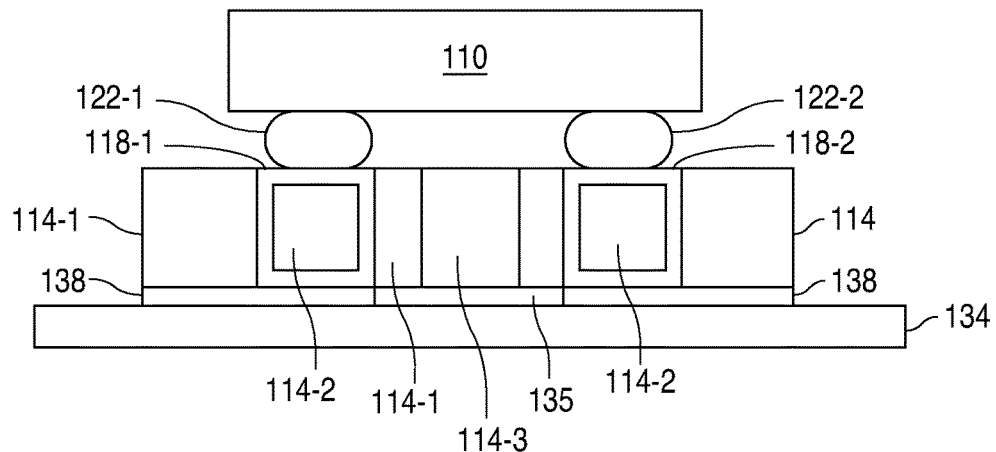
FIG. 1 illustrates a prior art device including an LED mounted on a submount.
Figure 2:
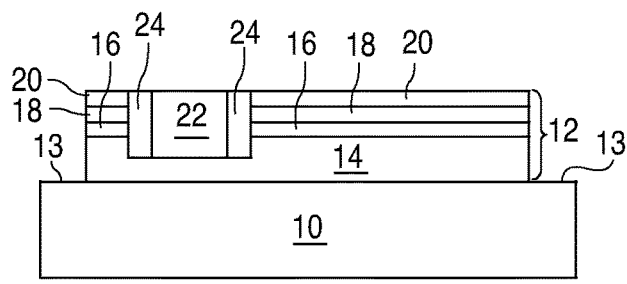
FIG. 2 illustrates a semiconductor LED suitable for use in embodiments of the present invention.

FIG. 2 illustrates a semiconductor light emitting device suitable for use in embodiments of the invention. The device illustrated in FIG. 2 is just one example of a device that may be used with embodiments of the invention. Any suitable device may be used with embodiments of the invention— embodiments of the invention are not limited to the details illustrated in FIG. 2. For example, though FIG. 2 illustrates a flip-chip device, embodiments of the invention may be used with other device geometries and are not limited to flip-chip devices.

The device illustrated in FIG. 2 may be formed by first growing a semiconductor structure on a growth substrate 10, as is known in the art. The growth substrate 10 may be any suitable substrate such as, for example, sapphire, SiC, Si, GaN, or composite substrates. An n-type region 14 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 16 is grown over the n-type region. Examples of suitable light emitting regions include a single thick or thin light emitting layer, or a multiple quantum well light emitting region including multiple thin or thick light emitting layers separated by barrier layers. A p-type region 18 may then be grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 µm in some embodiments and less than 6 µm in some embodiments.

A p-contact metal 20 is formed on the p-type region. The p-contact metal 20 may be reflective and may be a multi-layer stack. For example, the p-contact metal may include a layer for making ohmic contact to the p-type semiconductor material, a reflective metal layer, and a guard metal layer that prevents or reduces migration of the reflective metal. The semiconductor structure is then patterned by standard photolithographic operations and etched to remove a portion of the entire thickness of the p-contact metal, a portion of the entire thickness of the p-type region, and a portion of the entire thickness of the light emitting region, to form at least one mesa which reveals a surface of the n-type region 14 on which a metal n-contact 22 is formed.

Figure 5:
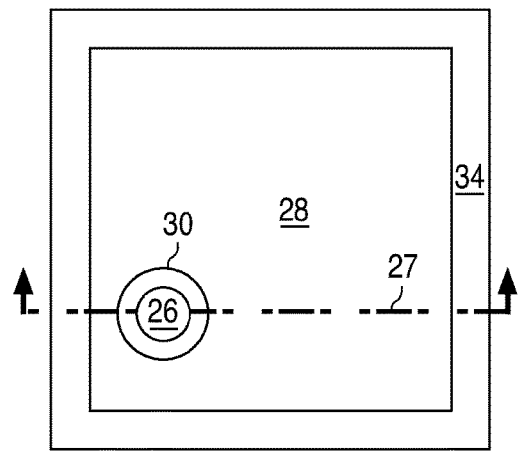
FIG. 5 is a plan view of the structure illustrated in cross sectional view in FIG. 4.

A plan view of the device illustrated in FIG. 2 would look similar to the plan view illustrated in FIG. 5. N-contact 22 may have the same shape as thick metal layer 26, described below. P-contact 20 may have the same shape as thick metal layer 28, described below. The n-contact and the p-contact are electrically isolated by a gap 24 which may be filled with a solid, a dielectric, an electrically insulating material, air, ambient gas, or any other suitable material. The p- and n-contacts may be any suitable shape and may be arranged in any suitable way. Patterning a semiconductor structure and forming n- and p-contacts is well known to a person of skill in the art. Accordingly, the shape and arrangement of the n- and p-contacts is not limited to the embodiment illustrated in FIGS. 2 and 5.

Though a single light emitting device is illustrated in FIG. 2, it is to be understood that the device illustrated in FIG. 2 is formed on a wafer that includes many such devices. In the regions 13 between individual devices on a wafer of devices, the semiconductor structure may be etched down to an insulating layer, which may be an insulating semiconductor layer that is part of the semiconductor structure, or the growth substrate, as illustrated in FIG. 2.

Figure 3:
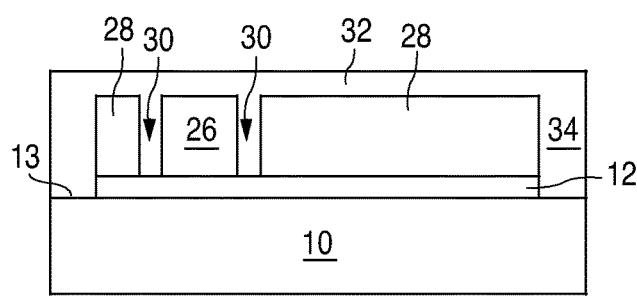
FIG. 3 illustrates thick metal layers formed on the metal contacts of a semiconductor LED.
Figure 4:
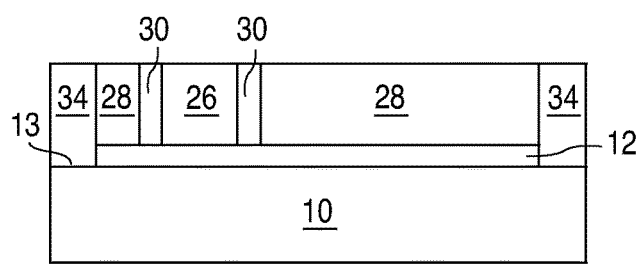
FIG. 4 illustrates the structure of FIG. 3 after planarizing the electrically insulating layer.

FIGS. 3 and 4 illustrate preparing a wafer of LED devices for bonding to a support substrate wafer, described below. The LED structure illustrated in FIG. 2, which includes the semiconductor structure including the n-type region, the p-type region, and the light emitting region, and the n- and p-contacts, is represented in simplified form by structure 12 in the FIGS. 3 and 4.

In embodiments of the invention, thick metal layers are formed on the n- and p-contacts of the LED. The thick metal layers may be formed on a wafer scale, before a wafer of devices is diced into individual or smaller groups of devices. The thick metal layers may support the device structure of FIG. 2 after the wafer of devices is diced, and may support the device structure of FIG. 2 during removal of the growth substrate in some embodiments.

FIG. 3 illustrates thick metal layers formed on the n- and p-contacts of LED 12. In some embodiments, a base layer, which is not shown in FIG. 3, is formed first. The base layer is a metal layer or layers on which the thick metal layers are deposited. For example, the base layer may include an adhesion layer, the material of which is selected for good adhesion to the n- and p-contacts, and a seed layer, the material of which is selected for good adhesion to the thick metal layers. Examples of suitable materials for the adhesion layer include but are not limited to Ti, W, and alloys such as TiW. Examples of suitable materials for the seed layer include but are not limited to Cu. The base layer or layers may be formed by any suitable technique including, for example, sputtering or evaporation.

The base layer or layers may be patterned by standard lithographic techniques such that the base layer is present only where the thick metal layers are to be formed. Alternatively, a photoresist layer may be formed over the base layer and patterned by standard lithographic techniques to form openings where the thick metal layers are to be formed.

Thick metal layers 26 and 28 are formed simultaneously over the n- and p-contacts of LED 12. Thick metal layers 26 and 28 may be any suitable metal such as, for example, copper, nickel, gold, palladium, nickel-copper alloy, or other alloys. Thick metal layers 26 and 28 may be formed by any suitable technique including, for example, plating. Thick metal layers 28 and 30 may be between 20 µm and 500 µm in some embodiments, between 30 µm and 200 µm in some embodiments, and between 50 µm and 100 µm in some embodiments. Thick metal layers 26 and 28 support the semiconductor structure during later processing steps, in particular removal of the growth substrate, and provide a thermal pathway to conduct heat away from the semiconductor structure, which may improve the efficiency of the device.

After thick metal layers 26 and 28 are formed, an electrically insulating material 32 is formed over the wafer. The electrically insulating material 32 fills gaps 30 between the thick metal layers 26 and 28 and also fills gaps 34 between LEDs 12. The electrically insulating material 32 may optionally be disposed over the tops of thick metal layers 26 and 28. Electrically insulating material 32 is selected to electrically isolate metal layers 26 and 28 and to have a coefficient of thermal expansion that is matched or is relatively close to that of the metal(s) in thick metal layers 26 and 28. For example, electrically insulating material 32 may be a dielectric layer, a polymer, benzocyclobutene, one or more oxides of silicon, one or more nitrides of silicon, silicone, or epoxy in some embodiments. Electrically insulating material 32 may be formed by any suitable technique, including, for example, overmolding, injection molding, spinning on, and spraying on. Overmolding is performed as follows: An appropriately sized and shaped mold is provided. The mold is filled with a liquid material, such as silicone or epoxy, which when cured forms a hardened electrically insulating material. The mold and the LED wafer are brought together. The mold is then heated to cure (harden) the electrically insulating material. The mold and the LED wafer are then separated, leaving the electrically insulating material 32 over the LEDs, between the LEDs, and filling any gaps on each LED. In some embodiments, one or more fillers are added to the molding compound to form composite materials with optimized physical and material properties.

FIG. 4 illustrates an optional processing step, where the device is planarized, for example by removing any electrically insulating material overlying thick metal layers 26 and 28. Electrically insulating material 32 may be removed by any suitable technique, including, for example, microbead blasting, fly cutting, cutting with a blade, grinding, polishing, or chemical mechanical polishing. The electrically insulating material 30 between thick metal layers 26 and 28 is not removed, and the electrically insulating material 34 between adjacent LEDs is not removed.

FIG. 5 is a plan view of the structure shown in cross sectional view in FIG. 4. The cross section shown in FIG. 4 is taken at axis 27 shown in FIG. 5. The thick metal layer 26 formed on the n-contact illustrated in FIG. 2 is circular, though it may have any shape. The thick metal layer 26 is surrounded by the thick metal layer 28 formed on the p-contact illustrated in FIG. 2. Thick metal layers 26 and 28 are electrically isolated by electrically insulating material 30, which surrounds thick metal layer 26. Electrically insulating material 34 surrounds the device.

Separate from the preparation of the wafer of devices, illustrated in FIGS. 2, 3, and 4, a wafer of support substrates is prepared. FIGS. 6, 7, 8, 9, and 10 illustrate preparation of a support substrate wafer according to some embodiments. FIGS. 11, 12, 13, and 14 illustrate preparation of a support substrate according to alternative embodiments.

Figure 6:
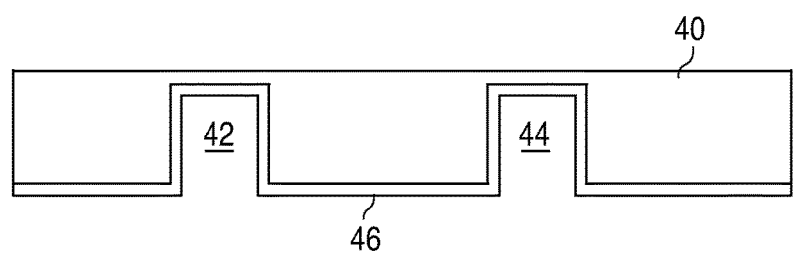
FIG. 6 illustrates a support substrate wafer after forming vias and forming a dielectric layer.

The support substrate wafer includes a body 40, as illustrated in FIG. 6. Body 40 may be, for example, Si, Ge, GaAs, or any other suitable material. Vias are formed in the body 40. Some vias 42 are placed to align with metal layers on the wafer of devices that electrically connect to the n-type region. Some vias 44 are placed to align with metal layers on the wafer of devices that electrically connect to the p-type region. After the vias are formed, a dielectric layer 46 is formed on the bottom surface of body 40, including in the insides of the vias. Dielectric layer 46 may be any suitable material such as, for example, an oxide of silicon formed by thermal growth or plasma-enhanced chemical vapor deposition (PECVD), or a nitride of silicon formed by PECVD.

Figure 7:
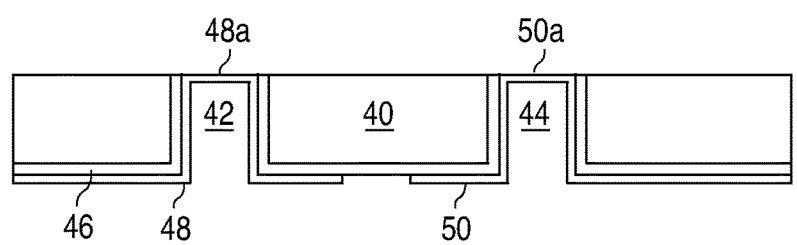
FIG. 7 illustrates the structure of FIG. 6 after forming a conductive layer and etching to reveal the conductive material at the tops of the vias.

In FIG. 7, a conductive layer is formed over dielectric layer 46 on the bottom surface of the body 40 and in vias 42 and 44. The conductive layer is patterned to form conductive layer 48 in via 42 and conductive layer 50 in via 44. Conductive layers 48 and 50 are electrically isolated from each other by a gap which exposes dielectric layer 46. The conductive layer may be, for example, a metal such as copper or gold. The conductive layer may be formed by first forming a seed layer over the entire bottom surface of the body, for example by sputtering, then patterning to remove the seed layer in the region between conductive layers 48 and 50. A thicker metal layer is then formed on the remaining portions of the seed layer, for example by plating.

After conductive layers 48 and 50 are formed, the body 40 is etched from the top surface, to expose the conductive layers 48*a* and 50*a* at the tops of vias 42 and 44. Body 40 may be thinned by any suitable technique including wet or dry etching or a mechanical technique such as grinding. Though FIG. 7 illustrates a structure with a planar top surface, in some embodiments body 40 may be etched below the tops of conductive layers 48*a* and 50*a*.

Figure 8:
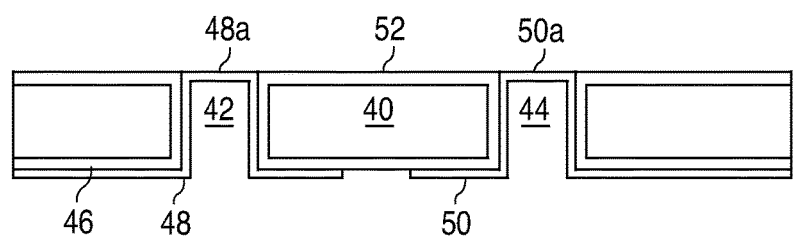
FIG. 8 illustrates the structure of FIG. 7 after forming a dielectric layer on the top of the thinned support substrate wafer.

In FIG. 8, a dielectric layer 52 is formed over the top of body 40, over the surface exposed by the thinning described in reference to FIG. 7. Dielectric layer 52 may be any suitable material such as, for example, an oxide of silicon formed by thermal growth or PECVD, or a nitride of silicon formed by PECVD. FIG. 8 illustrates a thermally grown dielectric layer 52, which may be self-aligned with conductive layers 48*a* and 50*a* such that a planar top surface is formed, assuming the surface was planar after the thinning illustrated in FIG. 7. If dielectric material is deposited, for example by PECVD, dielectric material may be deposited over conductive layers 48*a* and 50*a* at the tops of vias 42 and 44. The dielectric material deposited over conductive layers 48*a* and 50*a* may be removed by conventional lithography and etching steps. The top surface may be planar as illustrated in FIG. 8 though it need not be.

Figure 9:
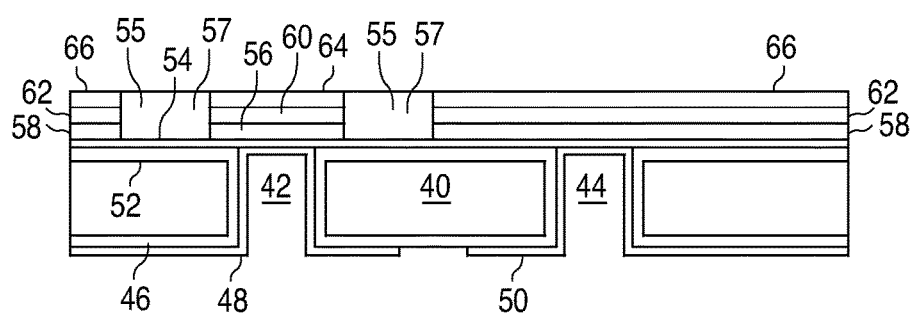
FIG. 9 illustrates the structure of FIG. 8 after depositing a seed layer and additional conductive layers.

In FIG. 9, one or more conductive layers are formed on the top surface of body 40. The one or more conductive layers may be any suitable material formed by any suitable process. In FIG. 9, the conductive layers include a copper layer, a nickel layer, and a gold/tin layer. The conductive layers are in direct contact with conductive layers 48*a* and 50*a* at the tops of vias 42 and 44. The conductive layers may be shaped to align with thick metal layers 26 and 28, shown in plan view in FIG. 5, formed on the wafer of devices. To form the conductive layers illustrated in FIG. 9, a seed layer 54 of copper is formed over the top of body 40. The seed layer may be patterned such that photoresist 57 is formed over areas where the conductive layers are not to be formed, such as in gaps 55 that provide electrical isolation between the conductive layers electrically connected to metal 48 in via 42 and the conductive layers electrically connected to metal 50 in via 44. A thick copper layer is then formed, for example by plating, followed by a nickel layer formed by plating, followed by a gold/tin layer formed by sequentially plating gold and tin at a thickness ratio of 4:1.

Figure 10:
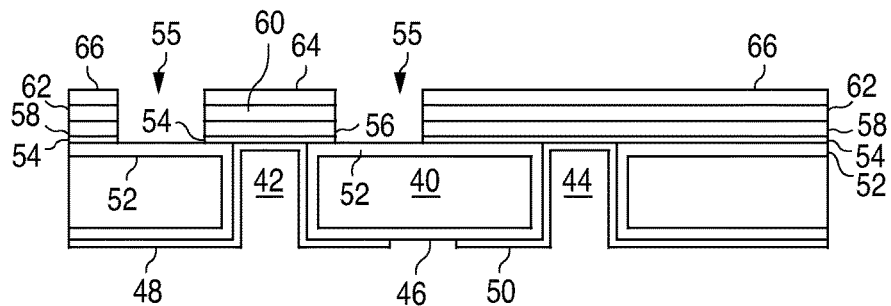
FIG. 10 illustrates the structure of FIG. 9 after removing remaining seed layer.

The photoresist 57 is then removed, as illustrated in FIG. 10, leaving gaps 55 that electrically isolate conductive layers 56, 60, and 64 from conductive layers 58, 62, and 66. Copper layer 56, nickel layer 60, and gold/tin layer 64 are formed over conductive layer 48 in via 42. Copper layer 58, nickel layer 62, and gold/tin layer 66 are formed over conductive layer 50 in via 44.

After the photoresist is removed from gaps 55, seed layer 54 formed in FIG. 9 remains in the gaps 55 between copper, nickel, and gold/tin layers formed over via 42 and those layers formed over via 44. The seed layer in gaps 55 may be removed by etching, as illustrated in FIG. 10, such that dielectric layer 52 is exposed in the bottom of gaps 55. The structure may be annealed at elevated temperature, to cause the plated gold and tin layers to form a gold/tin eutectic. The gold/tin eutectic is later used as the bonding layer to attach the support substrate wafer to the wafer of devices.

Figure 11:
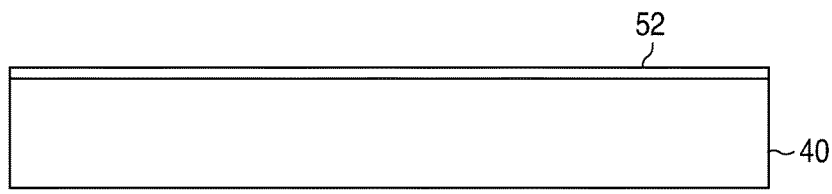
FIG. 11 illustrates a support substrate wafer after forming a dielectric layer.

FIGS. 11, 12, 13, and 14 illustrate an alternative method for preparing the support substrate wafer. Like structures may be the same materials and formed by the same techniques described above in reference to FIGS. 6, 7, 8, 9, and 10. In FIG. 11, dielectric 52 is formed over the top surface of body 40. Dielectric layer 52 may be any suitable material such as, for example, an oxide of silicon formed by thermal growth or PECVD, or a nitride of silicon formed by PECVD.

Figure 12:
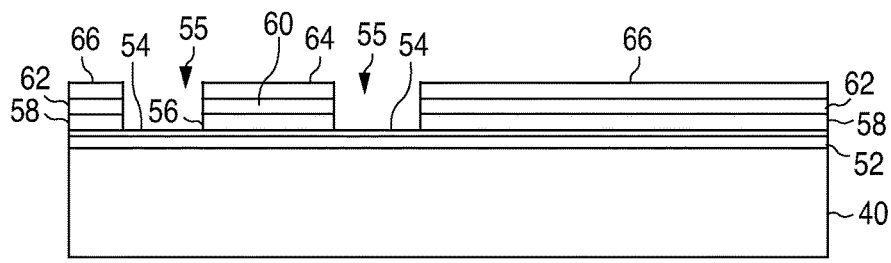
FIG. 12 illustrates the structure of FIG. 11 after forming one or more conductive layers.

In FIG. 12, conductive layers are formed on the top surface of body 40, and patterned. As described above in reference to FIG. 9, one or more conductive layers may be any suitable material formed by any suitable process. In FIG. 12 as in FIG. 9, the conductive layers include a copper layer, a nickel layer, and a gold/tin layer. To form the conductive layers illustrated in FIG. 9, a seed layer 54 of copper is formed over the top of body 40. The seed layer may be patterned such that photoresist is formed over areas where the conductive layers are not to be formed, such as in a gap 55 between later-formed vias 42 and 44, which provides electrical isolation. A thick copper layer is then formed, for example by plating, followed by a nickel layer formed by plating, followed by a gold/tin layer formed by sequentially plating gold and tin at a thickness ratio of 4:1 or by plating a gold/tin alloy of appropriate composition. The photoresist is then removed, resulting the structure illustrated in FIG. 12. Copper layer 56, nickel layer 60, and gold/tin layer 64 are formed over in the region of later-formed via 42. Copper layer 58, nickel layer 62, and gold/tin layer 66 are formed in the region of later-formed via 44. Seed layer 54 remains in the areas between the conductive metal layers.

Figure 13:
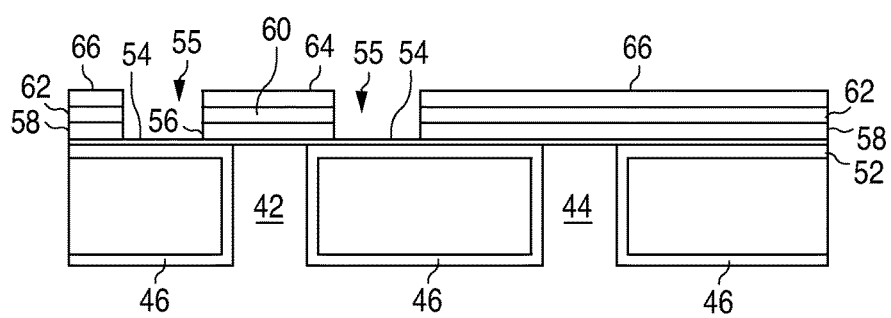
FIG. 13 illustrates the structure of FIG. 12 after forming vias and a dielectric layer.

In FIG. 13, vias 42 and 44 are formed by conventional patterning and etching steps. Vias 42 and 44 are formed on the bottom surface of body 40 and extend toward the top surface of body 40. Vias 42 and 44 extend through dielectric layer 52 to the bottom of conductive layers 56 and 58, respectively. The conductive layers 56 and 58, often a metal such as copper, serve as an etch stop layer for the etching step that forms vias 42 and 44.

A dielectric layer 46 is formed on the bottom surface of body 40 and in vias 42 and 44. Dielectric layer 46 may be any suitable material such as, for example, an oxide of silicon formed by thermal growth or PECVD, or a nitride of silicon formed by PECVD. After dielectric layer 46 is formed, a conductive layer is formed on the bottom surface of body 40 and in vias 42 and 44. Conductive layer 48 is in direct contact with copper seed layer 54 at the top of via 42. Conductive layer 50 is in direct contact with copper seed layer 54 at the top of via 44. Conductive layers 48 and 50 are electrically isolated from each other by a gap 49 which exposes dielectric layer 46. The conductive layer may be, for example, a metal such as copper or gold. The conductive layer may be formed by first forming a seed layer over the entire bottom surface of the body, for example by sputtering, then patterning to form a photoresist layer in the region between conductive layers 48 and 50. A thicker metal layer is then formed on the portions of the seed layer not covered by photoresist, for example by plating. The photoresist is removed, then the seed layer in the gap 49 between the thicker metal layers 48 and 50 is removed, for example by etching. Likewise, the seed layer 54 is removed from gaps 55 by etching to isolate the metal stack 56,60, 64 from the metal stack 52, 58, 62. The structure may be annealed, for example at a temperature of at least 200° C.

Figure 14:
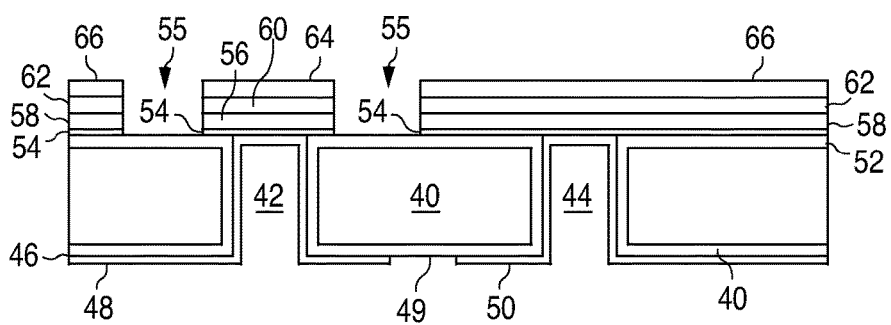
FIG. 14 illustrates the structure of FIG. 13 after forming conductive layers on the bottom of the support substrate wafer.
Figure 15:
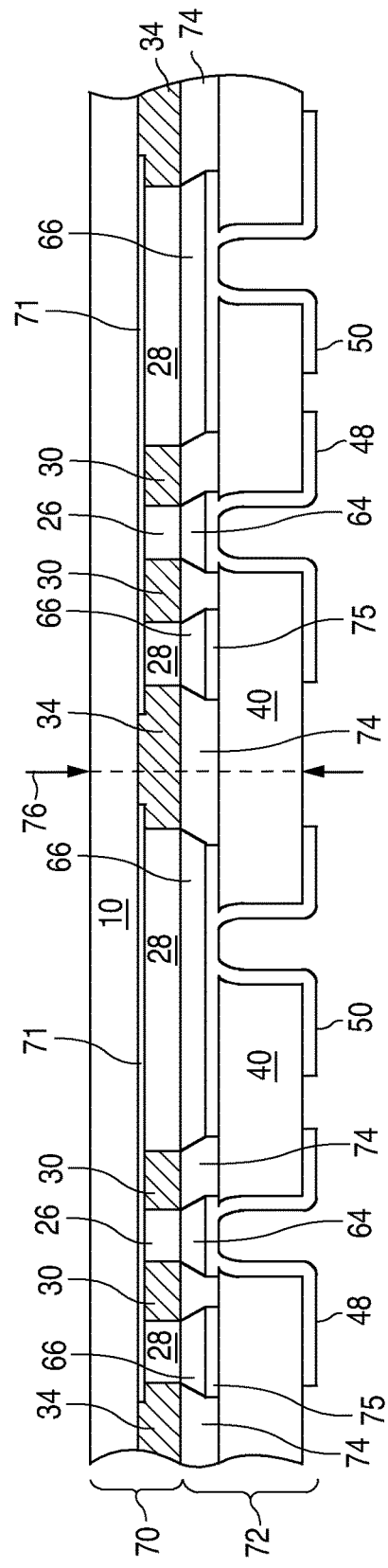
FIG. 15 illustrates a portion of a wafer of devices bonded to a portion of a wafer of support substrates.

FIG. 15 illustrates a portion of a wafer 70 of devices, such as the device illustrated in FIG. 4, attached to a wafer 72 of support substrates, such as the support substrates illustrated in FIGS. 10 and 14. The wafers 70 and 72 are bonded together by aligning the metal regions 64, 66 on the top of support substrate wafer 72 with the metal regions 26, 28 on the bottom of device wafer 70, then heating the structure to reflow the metal layers 64 and 66. Metal layers 64 and 66 may have the same shape as metal regions 26 and 28, illustrated in FIG. 5. Regions 75 are connected to conductive layer 50 outside the plane illustrated in FIG. 15. In some embodiments, metal layers 64 and 66 are a gold/tin eutectic, though any material that is sufficiently conductive and suitable for bonding can be used. In some embodiments, insulating material 30, 34 is a material that metal layers 64 and 66 will not wet when metal layers 64 and 66 are reflowed. Because metal layers 64 and 66 will not wet the insulating material 30, 34 on the bottom of device wafer 70, gaps 74 filled with ambient gas are formed between the metal layers 64 and 66. Also, because metal layers 64 and 66 on wafer 72 will wet only metal regions 26 and 28 on wafer 70 and not insulating material 30 and 34, metal layers 64 and 66 and metal regions 26 and 28 do not have to have precisely the same shape, and do not need to be precisely aligned, as illustrated in FIG. 15.

Two devices are illustrated in FIG. 15, though it is to be understood that the structures illustrated in FIG. 15 are repeated across both wafers. After bonding, the wafer may be diced, which separates the two devices at position 76. Each semiconductor structure 71 on device wafer 70, illustrated in more detail in FIG. 2 as semiconductor layers 14, 16, and 18 and illustrated in simplified form in FIG. 15, is completely enclosed and sealed by growth substrate 10 on the top of semiconductor structure 71, and by metal regions 26 and 28 and insulating material 30 and 34 on the bottom. The n- and p-contacts 22 and 20, illustrated in FIG. 2, are also protected by the seal. As described above, the seal is formed by wafer-level processing steps that occur while the semiconductor structures 71 are connected to growth substrate 10. During the bonding to support substrate wafer 72 illustrated in FIG. 15, no material can contact the semiconductor structure 71. In particular, the seal formed by metal regions 26, 28 and insulating material 30, 34, prevents metal bonding layers 64, 66, or any other material from contacting the semiconductor structure 71 during bonding to support substrate 72.

In some embodiments, after bonding to support substrate 72, the growth substrate 10 is removed from the structure illustrated in FIG. 15. The growth substrate may be removed by any suitable technique, including, for example, laser lift-off, etching, mechanical techniques such as grinding, or a combination of techniques. In some embodiments, the growth substrate is sapphire and is removed by wafer-scale laser lift-off. Since the sapphire substrate does not need to be thinned before removal and has not been diced, it can be reused as a growth substrate. In some embodiments, the growth substrate 10 is only thinned, such that a portion of the growth substrate remains on the final device. In some embodiments, the entire growth substrate 10 remains on the final device.

In some embodiments, the surface of the semiconductor structure exposed by removing the growth substrate, typically a surface of n-type region 14 (illustrated in FIG. 2), may be optionally thinned and roughened, for example by photoelectrochemical etching.

The wafer of devices is then diced into individual or groups of LEDs. Individual or groups of LEDs may be separated by sawing, scribing, breaking, cutting, or otherwise separating neighboring LEDs at position 76, as illustrated in FIG. 15. In some embodiments, the growth substrate 10 is thinned or removed after dicing, rather than before.

One or more optional structures such as filters, lenses, dichroic materials, or wavelength converting materials may be formed over the LEDs, before or after dicing. A wavelength converting material may be formed such that all or only a portion of the light emitted by the light emitting device and incident on the wavelength converting material may be converted by the wavelength converting material. Unconverted light emitted by the light emitting device may be part of the final spectrum of light, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting material, and a UV-emitting LED combined with blue-, green-, and red-emitting wavelength converting materials. Wavelength converting materials emitting other colors of light may be added to tailor the spectrum of light emitted from the device. The wavelength converting material may be conventional phosphor particles, quantum dots, organic semiconductors, II-VI or III-V semiconductors, II-VI or III-V semiconductor quantum dots or nanocrystals, dyes, polymers, or materials such as GaN that luminesce. Any suitable phosphor or other wavelength converting material may be used.

The thick metal layers 26 and 28 and the electrically insulating material that fills gaps between the thick metal layers and between neighboring LEDs provide mechanical support to the semiconductor structure during bonding, substrate removal, dicing, and other processing. The seal around the semiconductor structure formed by thick metal layers 26 and 28 and insulating material 30 and 34 protects the semiconductor structure from contamination during bonding and other processing steps.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A method comprising:
   providing a wafer of light emitting semiconductor devices, each light emitting semiconductor device comprising an n-type region, a p-type region, a first metal contact in direct contact with the n-type region, and a second metal contact in direct contact with the p-type region;
   forming a first metal layer configured to provide support to the light emitting semiconductor device during later processing on the first contact of each light emitting semiconductor device;
   forming a second metal layer configured to provide support to the light emitting semiconductor device during later processing on the second metal contact of each light emitting semiconductor device;
   surrounding the first metal layer with an insulating layer to fill a first opening between the first metal layer and the second metal layer;
   planarizing the insulating layer, first metal layer and second metal layer along a same plane;
   positioning the wafer of light emitting semiconductor devices on and in contact with a wafer of support substrates, the wafer of support substrates comprising a plurality of metal regions formed on a surface of a body and separated by gaps filled with ambient gas, a bottom of each gap comprising a surface that is not wettable by the metal regions; and
   heating the wafer of light emitting semiconductor devices positioned on the wafer of support substrates and reflowing any portions of the plurality of metal regions in contact with a surface of the insulating layer facing the wafer of support substrates into contact with one of the first metal layer and the second metal layer and off of the surface of the insulating layer, leaving the plurality of metal regions in contact with only one of the first metal layer and second metal layer.

2. The method of claim 1 wherein positioning the wafer of light emitting semiconductor devices on and in contact with a wafer of support substrates comprises aligning the plurality of metal regions on the wafer of support substrates with the first and second metal layers on the wafer of light emitting semiconductor devices.

3. The method of claim 1 wherein forming a first metal layer configured to provide support to the light emitting semiconductor device during later processing on the first contact of each light emitting semiconductor device and forming a second metal layer configured to provide support to the light emitting semiconductor device during later processing on a second metal contact of each light emitting semiconductor device comprises plating first and second metal layers on the wafer of light emitting semiconductor devices.

4. The method of claim 1 wherein the first and second metal layers are at least 50 μm thick.

5. The method of claim 1 further comprising dicing the wafer of light emitting semiconductor devices after attaching the wafer of light emitting semiconductor devices to a wafer of support substrates.

6. The method of claim 1 further comprising removing a growth substrate from the wafer of light emitting semiconductor devices after attaching the wafer of light emitting semiconductor devices to a wafer of support substrates.

7. The method of claim 1 further comprising forming the wafer of support substrates, wherein forming the wafer of support substrates comprises:
   providing a body;
   etching a plurality of vias in the body, each of the vias extending from a bottom surface of the body toward a top surface of the body; and
   lining sidewalls and a top of each of the vias with metal.

8. The method of claim 7 wherein forming the wafer of support substrates further comprises:
   thinning the body from the top surface of the body to expose the metal at the top of each via;
   forming regions of bonding metal on the top surface of the body, wherein the regions of bonding metal are in direct contact with the metal at the top of each via; and
   forming an electrically insulating layer on a top surface of the body.

9. The method of claim 1 further comprising forming the wafer of support substrates wherein forming the wafer of support substrates comprises:
   providing a body;
   forming a bonding metal layer on a top surface of the body;
   etching a plurality of vias in the body, each of the vias extending from a bottom surface of the body toward a top surface of the body and terminating on the bonding metal layer formed on the top surface of the body.

10. The method of claim 1 wherein the first and second metal layers and the insulating layer protect the semiconductor structure from contamination.

11. The method of claim 1 wherein the second metal contact surrounds the first metal contact.

12. The method of claim 1 wherein
   surrounding the first metal layer with an insulating layer comprises molding over the first and second metal layers an electrically insulating layer that fills spaces between the first and second metal layers.

13. The method of claim 12 wherein molding over the first and second metal layers an electrically insulating layer that fills spaces between the first and second metal layers comprises:
   positioning a mold over the wafer of light emitting semiconductor devices;
   filling the mold with electrically insulating molding material; and
   curing the molding material.

14. A method comprising:
   providing a wafer of light emitting semiconductor devices, each light emitting semiconductor device comprising an n-type region, a p-type region, a first metal contact in direct contact with the n-type region, and a second metal contact in direct contact with the p-type region;
   forming a first metal layer directly on the first contact of each light emitting semiconductor device;
   forming a second metal layer directly on the second contact of each light emitting semiconductor device;
   forming a wafer of support substrates separate from the wafer of light emitting semiconductor devices, forming the wafer of support substrates comprising:
      providing a body;
      forming a patterned photoresist on the body;
      forming a stack of conductive layers on the body in the patterned photoresist, the stack comprising a lower layer of a third metal and an upper layer of a fourth metal different from the third metal; and
      removing the patterned photoresist to form a gap in the stack of conductive layers, the gap extending through both the upper layer and the lower layer;
   positioning the wafer of support substrates on the wafer of light emitting substrates with an upper surface of the stack of conductive layers in contact with a first surface of the first metal layer opposite the light emitting semiconductor structure and a second surface of the second metal layer opposite the light emitting semiconductor structure; and
   heating the wafer of support structures positioned on the wafer of light emitting substrates.

15. The method of claim 14, wherein the stack of conductive layers further comprises a middle layer of a fifth metal different from the third and fourth metal.

16. The method of claim 14, wherein the third metal is a metal selected from the group consisting of copper and nickel.

17. The method of claim 14, wherein the fourth metal comprises at least one of gold and tin, and forming a wafer of support substrates separate from the wafer of light emitting semiconductor devices further comprises annealing the wafer of support substrates.

18. The method of claim 14, wherein, in a plan view, the second metal layer entirely covers the p-type region.

19. The method of claim 14, wherein the first metal layer and the second metal layer are formed simultaneously.

20. The method of claim 14, wherein the first and second metal layers have a thickness, the thickness configured to provide support to the light emitting semiconductor device during later removal of a growth substrate from a side of the light emitting semiconductor device opposite the first and second metal layers.

21. The method of claim 14, wherein the first and second metal layers are greater than 100 um thick.

22. The method of claim 14, further comprising:
   forming an insulating layer on the wafer of light emitting semiconductor devices between the first metal layer and the second metal layer, the insulating layer electrically insulating the first metal layer from the second metal layer, wherein positioning the wafer of support substrates on the wafer of light emitting substrates comprises positioning a surface of the insulating layer opposite the light emitting semiconductor structure over the gap.

23. The method of claim 22, wherein, after heating the wafer of support structures positioned on the wafer of light emitting substrate, the surface of the insulating layer opposite the light emitting semiconductor structure is entirely in contact with only ambient gas.

24. A device comprising:
   a semiconductor structure comprising a III-nitride light emitting layer sandwiched between an n-type region and a p-type region;
   a first metal layer in direct contact with the n-type region and a second metal layer in direct contact with the p-type region;
   a third metal layer in contact with the first metal layer and second metal layer, the third metal layer configured to support the semiconductor structure without a substrate;
   an insulating layer filling openings in the third metal layer to electrically isolate a first portion of the third metal layer over the first metal layer from a second portion of the third metal layer over the second metal layer;
   one or more stacks of conductive layers comprising a lower layer of a fourth metal and an upper layer of a fifth metal different from the fourth metal, the upper layer bonded to a surface of the third metal layer opposite the semiconductor structure;
   one or more gaps positioned between the one or more stacks of conductive layers and under the insulating layer; and a body comprising vias, the body covering the one or more gaps to enclose an ambient gas within each of the one or more gaps, each of the vias comprising a metal layer connected to one of the stacks of conductive layers.

* * * * *